United States Patent [19]
Ohhinata

[11] 4,315,168
[45] Feb. 9, 1982

[54] SEMICONDUCTOR SWITCH
[75] Inventor: Ichiro Ohhinata, Yokohama, Japan
[73] Assignee: Hitachi, Ltd., Tokyo, Japan
[21] Appl. No.: 82,026
[22] Filed: Oct. 5, 1979
[51] Int. Cl.³ .............................................. H03K 17/72
[52] U.S. Cl. .................................. 307/252 G; 307/305
[58] Field of Search .......... 307/252 A, 252 C, 252 D, 307/252 G, 252 J, 305

[56] References Cited
U.S. PATENT DOCUMENTS
4,071,779  1/1978  Kawanami .................. 307/252 G X

*Primary Examiner*—James B. Mullins
*Attorney, Agent, or Firm*—Craig and Antonelli

[57] ABSTRACT

A PNPN switch has a transistor for protecting the switch from the dv/dt effect, which is so connected as to shortcircuit one outermost PN junction PN of the switch. The transistor is driven by a drive circuit and not through the outer outermost PN junction of the switch by a drive circuit. The drive circuit is so designed that, in a transient mode, it operates as a transistor element and a capacitive element and, in a DC mode, it operates solely as a capacitive element. To this end, a transistor is used as the drive circuit. A level shift element is connected in series with the emitter-base junction of the drive transistor. The series circuit of the level shift element and the emitter-base junction is connected across the other PN junction and the collector of the drive transistor is connected to the base of the dv/dt protective transistor.

7 Claims, 6 Drawing Figures

SEMICONDUCTOR SWITCH

The present invention relates to a semiconductor switch of a PNPN four layered structure and, more particularly, to a semiconductor switch with a high dv/dt capability and a high gate sensitivity.

Prior to describe the present invention in comparison with the prior art, the drawing is briefly described.

In the turning-off state, the semiconductor switch with the PNPN four-layered structure (referred to as a PNPN switch) turns on when a sudden, abrupt forward voltage is applied between the anode and cathode of the PNPN switch. This phenomenon, called a dv/dt effect or a rate effect has been a serious problem. Many solutions have been proposed for this problem.

In U.S. Pat. No. 3,609,413 which is one of the proposals and shown in FIG. 1, a transistor Q3 is connected between the cathode gate GK and the cathode K of the PNPN switch having a PNP transistor Q1 and an NPN transistor Q2 for the purpose of improving the dv/dt capability and the gate firing sensitivity, and a capacitor C is connected between the anode A and the base of the transistor Q3. The connection of the capacitor shortcircuits the cathode gate - cathode path of the PNPN switch through the operation of the transistor Q3 when a transient voltage is applied to the switch.

Figure 1:
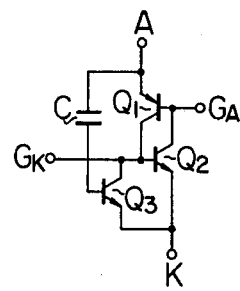
FIGS. 1 and 2 show circuit diagrams of a semiconductor switch which are prior arts of the invention.

In the circuit shown in FIG. 1, the base and the emitter of the transistor Q3 are open in connection and therefore the discharge circuit of the capacitor C is formed applying an inverse breakdown voltage between the base and the emitter of the transistor Q3. Thus, when a transient voltage is repetitively applied to the PNPN switch, the transistor Q3 for dv/dt protection is insufficiently driven, thus resulting in poor protection from dv/dt. The circuit shown in FIG. 1 also uses a capacitor for the capacitive element. In this respect, it is unfit for the semiconductor integrated circuit fabrication.

For obtaining the circuit construction suitable for the integrated circuit fabrication, it is conceivable that a PN junction is used in place of the capacitor as the capacitive element. In this case, however, an inverse breakdown voltage of the dv/dt protection circuit is reduced, so that the bidirectional high breakdown voltage characteristic of the PNPN switch is deteriorated.

Figure 2:
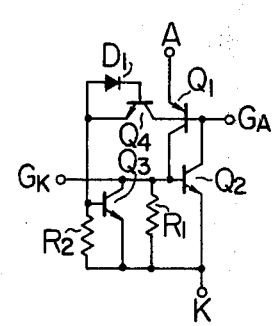

To solve this problem, a circuit as shown in FIG. 2 was proposed in U.S. Pat. No. 4,063,115 which was assigned to the same assignee as the present invention. In the circuit, a component for driving the dv/dt protective transistor Q3 is comprised of a transistor Q4 serving as a capacitive element which is inoperative in a DC mode but as a component of amplifying function in a transient mode. The transistor Q4, together with a discharge path including a resistor R2 and a diode D1, is connected between the anode gate GA and the base of the transistor Q3. This circuit arrangement may be driven by either the anode gate or the cathode gate, thus maintaining the bidirectional high breakdown voltage characteristic of the PNPN switch. Further, it may improve the poor driving of the transistor Q3 due to the charge/discharge circuit of the capacitive element Q4.

The circuit construction using the protective transistor Q3 for the purpose of improving the dv/dt capability, has essentially a competition of operation between the PNPN switch and the protective transistor. This requires the following characteristics for the protective transistor circuit:

(1) Before the PNPN switch is turned on to be in a holding condition, the protective transistor enters a saturation operating region and shortcircuits one outermost PN junction of the PNPN switch.

(2) Desirably, the protective transistor Q3 restores from the saturation after the stored charge in the PNPN switch disappears.

The item (2) is problematic particularly when the current amplification factor $R_{FE}$ of the PNP transistor Q1 constituting the PNPN switch is large.

In the circuit arrangement shown in FIG. 2, the drive current for the protective transistor Q3 is taken out through the junction between the anode A and the anode gate GA of the PNPN switch. With this circuit construction, the drive current component increases the stored charge of the PNPN switch, so that the charge stored time of the PNPN switch is elongated as compared with the protective transistor Q3, and thus a problem in its firing is likely to occur.

Accordingly, an object of the invention is to provide a semiconductor switch with a high dv/dt capability and a high gate sensitivity.

Another object of the invention is to provide a semiconductor switch which is free from an erroneous operation due to the competitive operation between a dv/dt effect protective transistor and a PNPN switch, and the deterioration of the bidirectional high breakdown voltage characteristic of the PNPN switch due to the use of the dv/dt effect protective transistor and which exhibits a high gate sensitivity for the driving from either the anode gate GA or the cathode gate GK, and further is suitable for the semiconductor integrated circuit fabrication.

A PNPN switch according to the invention has a first transistor for protecting the switch from the dv/dt effect, which is so connected as to shortcircuit one outermost PN junction of the switch. The first transistor is driven by a drive circuit and not through the other PN junction of the switch. The drive circuit is so designed that, in a transient mode, it operates as a transistor element as well as a capacitive element and, in a DC mode, it operates solely as a capacitive element. To this end, a second transistor is used as the drive circuit. A level shift element is connected in series with the emitter-base junction of the drive transistor. The series circuit of the level shift element and the emitter-base junction is connected across the other outermost PN junction and the collector of the drive transistor is connected to the base of the dv/dt protective transistor.

Figure 3:
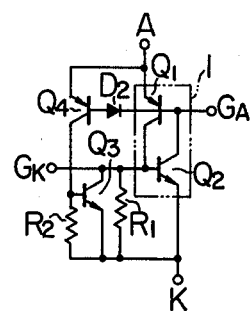
FIGS. 3 to 6 show circuit diagrams of first to fourth embodiments of the semiconductor switch according to the invention.

Referring now to FIG. 3, there is shown a circuit diagram of a first embodiment of a semiconductor switch according to the invention. In the figure, Q1 and Q2 designate a PNP transistor and an NPN transistor which cooperatively constitute a PNPN switch 1. In the switch, a P-emitter corresponds to an anode A; an N base to a cathode gate GK; an N emitter to a cathode K. Q3 designates a transistor for protecting the PNPN switch from the dv/dt effect to shortcircuit a PN junction between the cathode gate GK and the cathode K. Q4 designates a drive transistor to drive the dv/dt effect protective transistor Q3. D2 designates a diode as a level shift element. R1 and R2 are resistors. With this circuit construction, when an abruptly rising transient voltage is applied between the anode A and the cathode K, a driving current of the transistor Q3 is supplied through the PNP transistor Q4 to the transistor Q3. The transistor Q4 feeds a current almost equal to a current component passing through the emitter-base junction of the PNP transistor Q1 due to the transistor operation and a capacitive current component passing through the collector-base junction capacitance of the PNP transistor Q1. As the base-collector junction capacitance of the PNP transistor Q4 is larger, the transistor Q4 more fully drives the dv/dt protective transistor Q3. An increase of the current passing through the emitter-base junction of the PNP transistor Q1 as a result of the connection of the drive transistor Q4 may be minimized by making the junction capacitance of the level shift diode D2 as small as possible. For this reason, even when the current amplification factor of the PNP transistor Q1 becomes large as a result of instability of the manufacturing process or the like, the dv/dt effect protection ability is ensured. The discharge path for the base-collector junction capacitor of the PNP transistor Q4 is formed by the resistor R2 and the level shift diode D2. The base-collector junction capacitor of the transistor Q4 is discharged when the PNPN switch 1 is in an ON state, like the base-collector junction capacitance of the PNP transistor Q1. Therefore, if a repetitive transient voltage is applied to the switch, the dv/dt effect protection ability is ensured.

With respect to the DC operation of the semiconductor switch of the embodiment, if the PNP transistor Q4 and the dv/dt effect protective transistor Q3 operate, the PNPN switch 1 would fail to be fired. In the circuit construction shown in FIG. 3, a series circuit including the base-emitter junction of the PNP transistor Q4 and the level shift diode D2 is connected in parallel with the anode A - the anode-gate junction. This circuit connection renders the PNP transistor Q4 the OFF state when the PNPN switch 1 is driven through the gates $G_K$ and $G_A$, and is in the ON state. Therefore, the dv/dt effect protective transistor Q3 is not driven and thus is in the OFF state. Consequently, the gate firing sensitivity and the minimum holding current of the PNPN switch 1 are determined by the resistor R1. The resistance of the resistor R1 is sufficient to such an extent as to prevent an erroneous firing due to the leak current of the PNPN switch since it does not need a great protection from the dv/dt effect. For this reason, the firing sensitivity from the gate of the PNPN switch 1 is high. With respect to the bilateral high breakdown voltage characteristic, by forming the PNP transistor Q4 as a lateral type PNP transistor like the transistor Q1 of the switch 1, the N base area is of high resistance, so that the bidirectional high breakdown voltage characteristic is secured.

Figure 4:
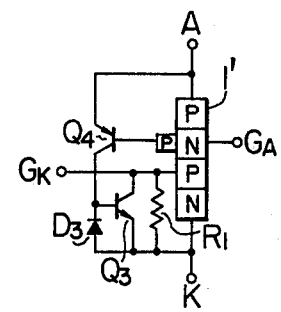

Turning now to FIG. 4, there is shown a second embodiment of the semiconductor switch according to the invention. The second embodiment is useful particularly for the fabrication by the semiconductor integrated circuit. In the figure, reference numeral 1' designates a PNPN switch of the multi-emitter structure in which another P region is formed in the N base region of the PNPN switch. Reference character D3 designates a diode for providing a discharge electric path for the drive transistor Q4. The remaining components are the same as those with the like reference symbols in FIG. 3, thus omitting the description of them. The PNPN switch 1' of the multi-emitter structure is readily formed by a P-type area which is diffused in an N type base island together with P-type emitter and the P-type base when the lateral type PNPN switch is fabricated which is frequently used in the semiconductor integrated circuit. The P-type area serves as a level shift element corresponding to the diode D2 shown in FIG. 3. In a desirable device design, by designing is P-type area as small as possible, the PN junction capacitance between this P-type area and the N base is much smaller than that between the N base and the P collector. In the semiconductor integrated circuit, elements which may be formed within an isolation area is preferably formed in the same isolation area and not in another isolation area, as in the case of the multi-emitter structure of this embodiment, from an economical viewpoint. That is to say, if it is done so, the occupying area by the elements may be saved. The diode D3 serves as the discharge resistor R2 of the circuit in FIG. 3. A high resistance resistor necessary for ensuring a full drive of the dv/dt protective transistor Q3 and elongating a charge stored time thereof, may be formed with a small element occupying area by using a diode. Further, use of the diode is advantageous in that it exhibits a low resistance at the time discharge. The remaining circuit and the circuit operation of the embodiment shown in FIG. 4 is the same as that of the circuit shown in FIG. 3.

Figure 5:
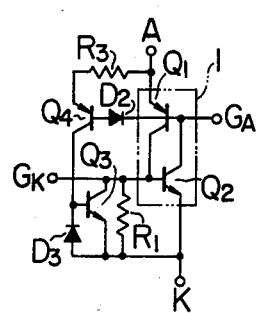

FIG. 5 shows a third embodiment of a semiconductor switch according to the invention. R3 designates a resistor and the remaining circuit components are the same as those with the like reference symbols shown in FIGS. 3 and 4. The resistor R3 serves as a level shift element and as a resistor restricting a transient current flowing through the drive transistor Q4. Like this, the level shift element may be connected in the emitter circuit in place of the base circuit. Such a connection of the level shift element prevents the drive transistor from operating in a DC mode. The insertion of the resistor R3, as in this embodiment, restricts a transient current flowing through the drive transistor Q4. In such a case that a large dt/dv capability characteristic is preferable although the transient current is relatively large, it is preferable not to use the resistor R3. On the other hand, when it is desired to properly restrict the transient current too, the adjusting of the transient current is possible by connecting the resistor R3, as shown in FIG. 5.

The remaining circuit and the operation of the circuit of the embodiment are the same as those in FIGS. 3 and 4. Accordingly, no elaboration of those will be described.

Figure 6:
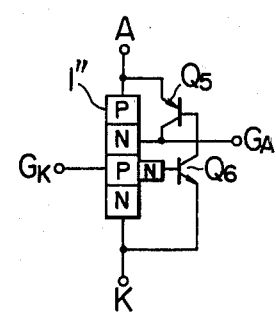

FIG. 6 shows a fourth embodiment of a semiconductor switch according to the invention, featuring a complemental circuit construction to the circuit construction of FIG. 4. As seen from the fact that the PNPN switch 1 may be equivalently expressed by using the PNP transistor Q1 and the NPN transistor Q2, when the bilateral high breakdown voltage characteristic can be born by the NPN transistor, a complementary circuit construction of the semiconductor switch is allowable with respect to the circuit construction of each embodiment as mentioned above. In the figure, 1" designates a PNPN switch with a multi-emitter structure in which another N-type area is formed in the P-type base area of the PNPN switch; Q5 a PNP transistor for dv/dt protection for shortcircuiting the PN junction between the anode A and the anode gate AG; Q6 a drive transistor for driving the dv/dt protection transistor Q5. As described above, the circuit construction of FIG. 6 is complementary to that of FIG. 4. Accordingly, the operation of the circuit of FIG. 4 will readily be understood when reference is made to the description of the circuit FIG. 4. None of the explanation will therefore be made.

As described above, in the semiconductor switch according to the invention, an erroneous firing preventive circuit i.e. a circuit for preventing an erroneous firing of the switch circuit due to the dv/dt effect is connected across the PNPN switch, through an active element. In the DC operation mode, the active element constituting the erroneous firing preventive circuit is in a cutoff state. When a transient voltage is applied to the switch, it serves as an active element, like the transistors of the PNPN switch. With such a circuit construction, even if the current amplification factor of the transistors of the PNPN switch becomes large due to the instability in the manufacturing process, the semiconductor switch could be sufficiently protected from the dv/dt effect. The semiconductor switch is fairly sensitive to gate driving without no degradation of the high breakdown voltage characteristic of the switch. The circuit construction of the switch of the invention is well adaptable for the integrated circuit fabrication, thus being economical.

What is claimed is:

1. A semiconductor switch comprising a PNPN switch, first and second transistors and a level shift element, wherein one outermost PN junction of said PNPN switch is shortcircuited by said first transistor, the emitter-base junction of said second transistor and said level shift element are connected in series, the series circuit is connected in parallel with the other outermost PN junction, and the collector of said second transistor is connected to the base of said first transistor.

2. A semiconductor switch comprising a PNPN switch, first and second transistors, a level shift element, a resistor, and an impedance element, wherein said resistor is connected in parallel with the emitter and the collector of said first transistor, one outermost PN junction of said PNPN switch is shortcircuited by said first transistor, the emitter-base junction of said second transistor and said level shift element are connected in series, the series circuit is connected in parallel with the other outermost PN junction, the collector of said second transistor is connected to the base of said first transistor, and said impedance element is connected between the base and the emitter of said first transistor.

3. A semiconductor switch according to claim 2, wherein said series circuit further includes a resistor, in which the emitter-base junction of said second transistor, and said level shift element are arranged in series fashion in this order.

4. A semiconductor switch comprising a PNPN switch, first and second transistors, a diode, and first and second resistors, wherein said first resistor is connected in parallel between the emitter and the collector of said first transistor, the collector and the emitter of said first transistor are connected to the cathode gate and the cathode of said PNPN switch, the emitter-base junction of said second transistor and said diode are connected in series, the series circuit is connected in parallel with the PN junction between the anode of said PNPN switch and the anode gate, the collector of said second transistor is connected to the base of said first transistor, and said second resistor is connected between the base and the emitter of said first transistor.

5. A semiconductor switch comprising a PNPN switch of a multi-emitter structure including an additional P-type region included in an N-base region of said PNPN switch, first and second transistors, a diode and a resistor, wherein said resistor is connected in parallel between the emitter and the collector of said first transistor, the collector and the emitter of said first transistor are connected to the cathode gate and the cathode of said PNPN switch, the emitter, the base and the collector of said second transistor respectively are connected to the anode, the additional P-type region and the base of said first transistor, and said diode is connected between the base and the emitter of said first transistor.

6. A semiconductor device comprising a PNPN switch, first and second transistors, first and second diodes and first and second resistors, wherein said first resistor is connected in parallel between the emitter and the collector of said first transistor, the collector and the emitter of said first transistor are connected to the cathode gate and the cathode of said PNPN switch, respectively, the emitter of said second transistor is connected through said second resistor to the anode of said PNPN switch, the base of said second transistor is connected through said first diode to the anode gate of said PNPN switch, the collector of said second transistor is connected to the base of said first transistor, and said second diode is connected between the base and the emitter of said first transistor.

7. A semiconductor switch comprising a PNPN switch of a multi-emitter structure including an additional N-type region included in a P-type base region of said PNPN switch, and first and second transistors, wherein the emitter and collector of said first transistor are connected between the anode and the anode gate of said PNPN switch, and the emitter, the base, and the collector of said second transistor are connected to the cathode and the additional N-type region of said PNPN transistor, and the base of said first transistor, respectively.

* * * * *